United States Patent [19]
Grant

[11] Patent Number: 5,828,588
[45] Date of Patent: Oct. 27, 1998

[54] PARAMETRIZABLE CONTROL MODULE COMPRISING FIRST AND SECOND LOADABLE COUNTER, AN ELECTRONIC CIRCUIT COMPRISING A PLURALITY OF SUCH PARAMETRIZED CONTROL MODULES, AND A METHOD FOR SYNTHESIZING SUCH CIRCUIT

[75] Inventor: Douglas M. Grant, Glasgow, Scotland

[73] Assignee: U.S. Philips Corporation, New York, N.Y.

[21] Appl. No.: 755,673

[22] Filed: Nov. 25, 1996

[30] Foreign Application Priority Data

Nov. 27, 1995 [EP] European Pat. Off. .............. 95203251

[51] Int. Cl.[6] .................................................. H03K 29/00
[52] U.S. Cl. ...................................... 364/718.04; 364/488
[58] Field of Search ..................................... 364/480, 757, 364/754.01, 725.03, 488, 718.04; 395/550

[56] References Cited

U.S. PATENT DOCUMENTS

| | | | |
|---|---|---|---|
| 5,005,193 | 4/1991 | Simpson | 377/33 |
| 5,159,567 | 10/1992 | Gobert | 364/757 |
| 5,175,753 | 12/1992 | Gaglani | 377/105 |
| 5,261,081 | 11/1993 | White et al. | 395/550 |
| 5,321,728 | 6/1994 | Andrieu | 375/106 |

*Primary Examiner*—Emanuel Todd Voeltz
*Assistant Examiner*—Matthew Smithers
*Attorney, Agent, or Firm*—Brian J. Wieghaus

[57] ABSTRACT

A parametrizable control module comprising first and second loadable counters, an electronic circuit comprising a plurality of such parametrized control modules, and a method for synthesizing such circuit.

A parametrizable control module comprises a first and a second loadable counter. Both counters are fed by a primary clock input. The first counter feeds an enable input of the second counter. An output of the second counter feeds a module output. Furthermore, both counter outputs by means of a logical combining gate feed the enable input of the second counter as well as the module output. The module has a reset input that feeds the reset inputs of both counters and the enabling input of the second counter. The parametrizable control module is useful for multiple application in a controller circuit. Also a method for synthesizing such circuits is given.

20 Claims, 10 Drawing Sheets

PARAMETRIZABLE CONTROL MODULE COMPRISING FIRST AND SECOND LOADABLE COUNTER, AN ELECTRONIC CIRCUIT COMPRISING A PLURALITY OF SUCH PARAMETRIZED CONTROL MODULES, AND A METHOD FOR SYNTHESIZING SUCH CIRCUIT

BACKGROUND TO THE INVENTION

The invention relates to a parametrizable control module comprising a first and a second loadable counting means, the first counting means being connected to a primary clock input and having a first output feeding an enable input of the second counting means, and a second output of the second counting means feeding a module output. The generating of programmable bit trains has been disclosed in EP Patent Application 579 324, corresponding U.S. patent application Ser. No. 08/499,556 to the present assignee and being herein incorporated by reference. A parametrizable control module can be used as a flexible development element in a development system for large-scale electronic circuitry.

A parametrizable control module is defined by the following tuple or set of integer values:
PCM(p[],i[],p_param,p_param_bits,i_param,i_param_bits, where
p[] is an array of p values to be hardwired;
i[] is an array of i values to be hardwired;
p_param=0 if no input p parameter is required, otherwise= 1;
p_param_bits is the maximum width for any input p parameter;
i_param=0 if no input i parameter is required, otherwise=1;
i_param_bits is the maximum width for any input i parameter.

In particular, p values correspond to the Period of a repetitive bit sequence and i values correspond to the number of Iterations of the sequence. The earlier realisation has proved to be insufficiently flexible for being useful in a wide range of applications, in particular because of its serial arrangement, wherein only the first counter is directly fed by the clock. Moreover, the earlier realization needs a microcontroller for being controlled, which is unwanted in many situations, where a multiplicity of such circuits is required.

SUMMARY OF THE INVENTION

In consequence, among other things, it is an object of the present invention to provide such a parametrizable control module that has more flexibility incorporated through a serial structure thereof, without necessity for a microcontroller. Now, according to one of its aspects, the invention is characterized in that the first and second output by means of a logical combining gate feed both the enable input of the second counting means and the module output, in that the second counting means is clocked as well by said primary clock input, and said module having a reset input that feeds the reset inputs of both counting means and the enabling input of the second counting means.

By itself, specifying a system as a hierarchical network of abstract state-based machines has been described in EP Patent Application 95202615.1, corresponding to U.S. patent application Ser. No. 08/721,161, and the realizing of state machines on a hardware level has been disclosed in U.S. Pat. No. 5,477,168, all to the present assignee and being herein incorporated by reference.

Advantageously, at least one of such counting means has a parameter input, or a parameter select input, or a value select input. In this way applicability of the parametrizable control module is raised greatly.

The invention also relates to an electronic circuit comprising a plurality of parametrized control modules according to the above. In this manner, versatile controller apparatuses can be constituted in a straightforward manner.

The invention also relates to a method for synthesizing a circuit as recited supra, through executing the steps of specifying each control signal in terms of one or more actual conditions, with associated values that may include shift values, within each iteration vector sorting all occurring values according to period length in a monotonous order;

if any parameter is present, determining minimum and maximum values of such parameter for taking into account for such sorting until no further unambiguous difference in size dictates further sorting according to said order;

under condition of If$p_{n-1}=p_n*I_n$,then:$I_{n-1}=I_{n-1}*I_n$;$p_{n-1}=p_n$, ignoring $p_n$ and $I_n$ and if $I_{n-1}$ is a parameter assiging $I_{n-1}$ to an appropriate other existing value or parameter, ignoring all p, I vector pairs that have $p_1$ equal to the cycle length and $I_1=1$, and mapping all parameters so ascertained on the circuit specification for synthesis.
It has been found that such iteration will most often lead to an optimum circuit.

Advantageously, subsequently to the latter ignoring, for those p,I pairs whose control modules will be reset by an input pulse, sorting associated signals according to ascending start times, and hierarchically solving the parameter specifying problem by:

generating a unique name for a control module with single p and I values as given control_module_p_I_UID;

for each signal with lowest start time, setting its hardware equal to that name;

setting a variable this_sig_first_available to that start time, whilst if the start time is a parameter, finding its minimum value from the parameter definitions, for using that as start time;

setting the variable this_sig_now_desired to the next highest start time;

if the two times found in the latter pair of steps are unrelated in that their parameters have nothing in common or one time is a parameter and another time is not, then instead of using a variable length shift register to delay the first signal in order to produce the second signal, using a new control module to later generate the second signal;

but if the two times found in those latter pair of steps are related in that either both are actual values, or both are defined by the same parameter, then comparing the area-cost of a shift register of length (this_sig_now_desired-this_sig_first_available), with the area-cost of an extra control module for the given p,I values, and selecting the best solution;

setting this_sig_first_available to the value of this_sig_now_desired and return to the latter one of the above pair of steps as long as there are further signals to be implemented.
This renders the process even more widely applicable.

Further advantageous aspects of the invention are recited in dependent claims.

BRIEF DESCRIPTION OF THE DRAWING

These and other aspects and advantages of the invention will be discussed more in detail with reference to the disclosure of preferred embodiments hereinafter, and in particular with reference to the appended Figures that show.

DETAILED DISCLOSURE OF PREFERRED EMBODIMENTS

Figure 1:
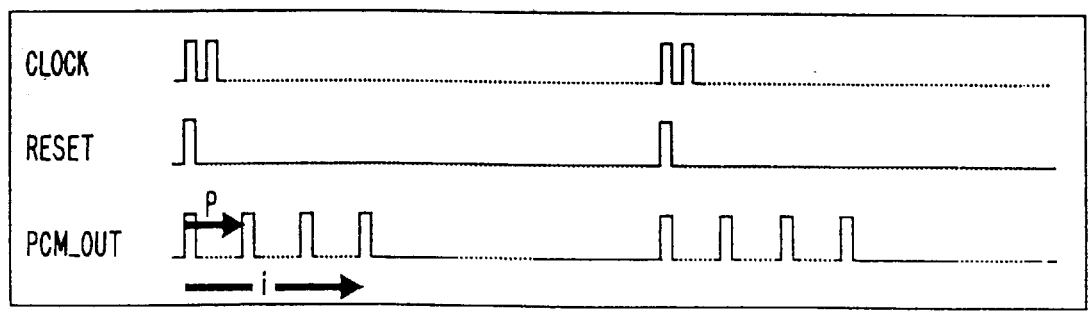
FIG. 1 the output bit sequence for given p and i.

FIG. 1 shows the principle of an output bit sequence for given p and i. The first trace shows the clock signal that is recurrently generated by an external source. Generally, its period is uniform in time, although this is not a strict requirement. The second trace shows the reset signal, each reset causing in principle one full cycle of output pulses of the parametrizable control module or PCM. If the next reset signal occurs before the end of the preceding output cycle, the earlier cycle is generally aborted. The third trace shows the output signal train of the parametrizable control module. Therein, the period p has been indicated as the interval separating two neighbouring output pulses (as measured in clock periods), the multiplicity i as the total number of output pulses.

Figure 2:
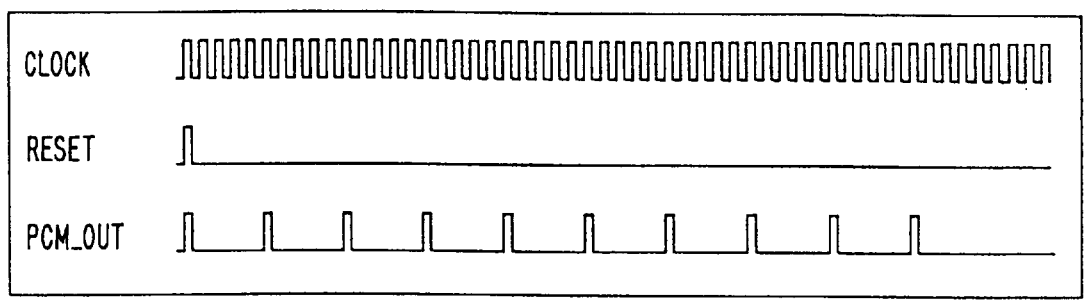
FIG. 2 the output bit sequence for p=5 and i=10.

FIG. 2 shows the output bit sequence for p=5 and i=10, as initiated by a single reset signal. In the realizations, a value that is hardwired into a control module is stored as (value minus one). Furthermore, parameters should be presented on an input port as (parameter minus one). Therefore, the example of FIG. 2 is realized by storing a value of four with respect to p, and a value of nine with respect to i.

Figure 3:
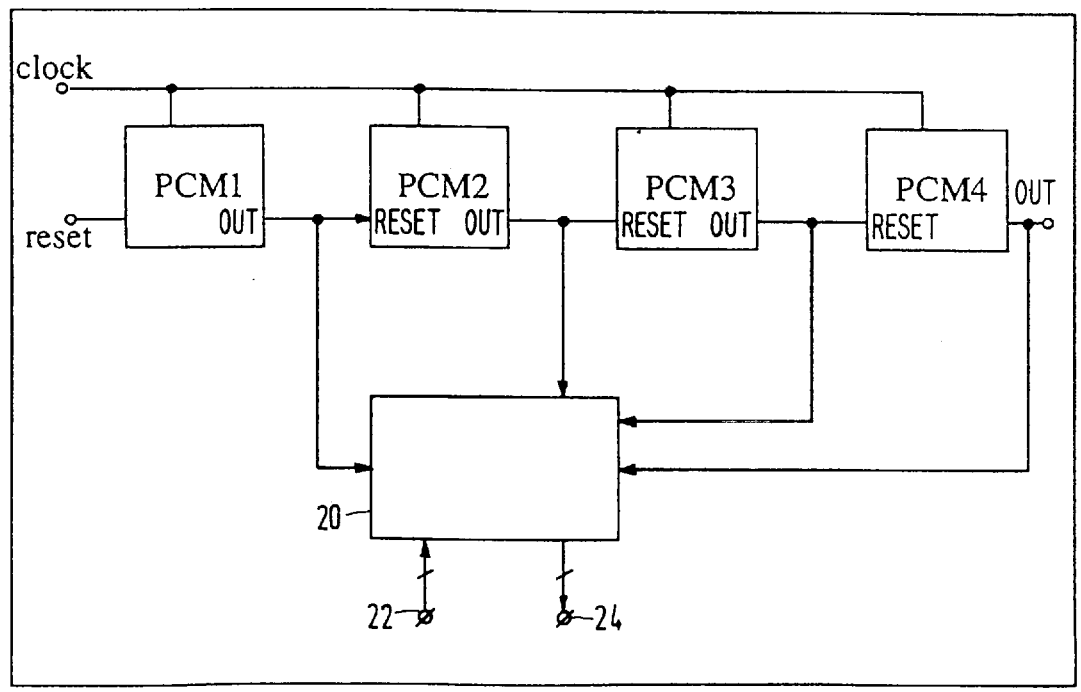
FIG. 3 a first module application configuration.

FIG. 3 shows a module application configuration. In this example, the modules are configured to constitute a chain, the output of the preceding module feeding the reset of the next module, and all modules in parallel being controlled by the same clock. The circuit furthermore comprises a user module 20 that is controlled by the output signals of the respective modules. Furthermore, the user module receives user input signals on input 22 of arbitrary bit width and generates user output signals on output 24 of arbitrary bit width. Of course, a less extensive solution is to have only a single parametrizable control module. The construction of the user module generally falls outside the scope of the present invention.

In this way it is possible to build a bit sequence generator as defined in terms of a p vector and an i vector, which are used to hierarchically rebuild the bit sequence. For example, in Digital Signal Processing Integrated Circuits there is a need for generating repetitive control bit sequences. When these can be defined in terms of a period vector p and an iteration vector i, a controller can be built using such modules. At design time, the p and i values will generally be unknown parameters. Instead of building a separate controller for each possible combination of such values by means of combinatorial logic, the parametrizable modules according to the invention may be used to implement the same functionality at a fraction of the costs. These modules may be chained into a pipeline by interposing a latch between each pair of modules, and resetting the first module in the chain one clock period earlier.

Figure 4:
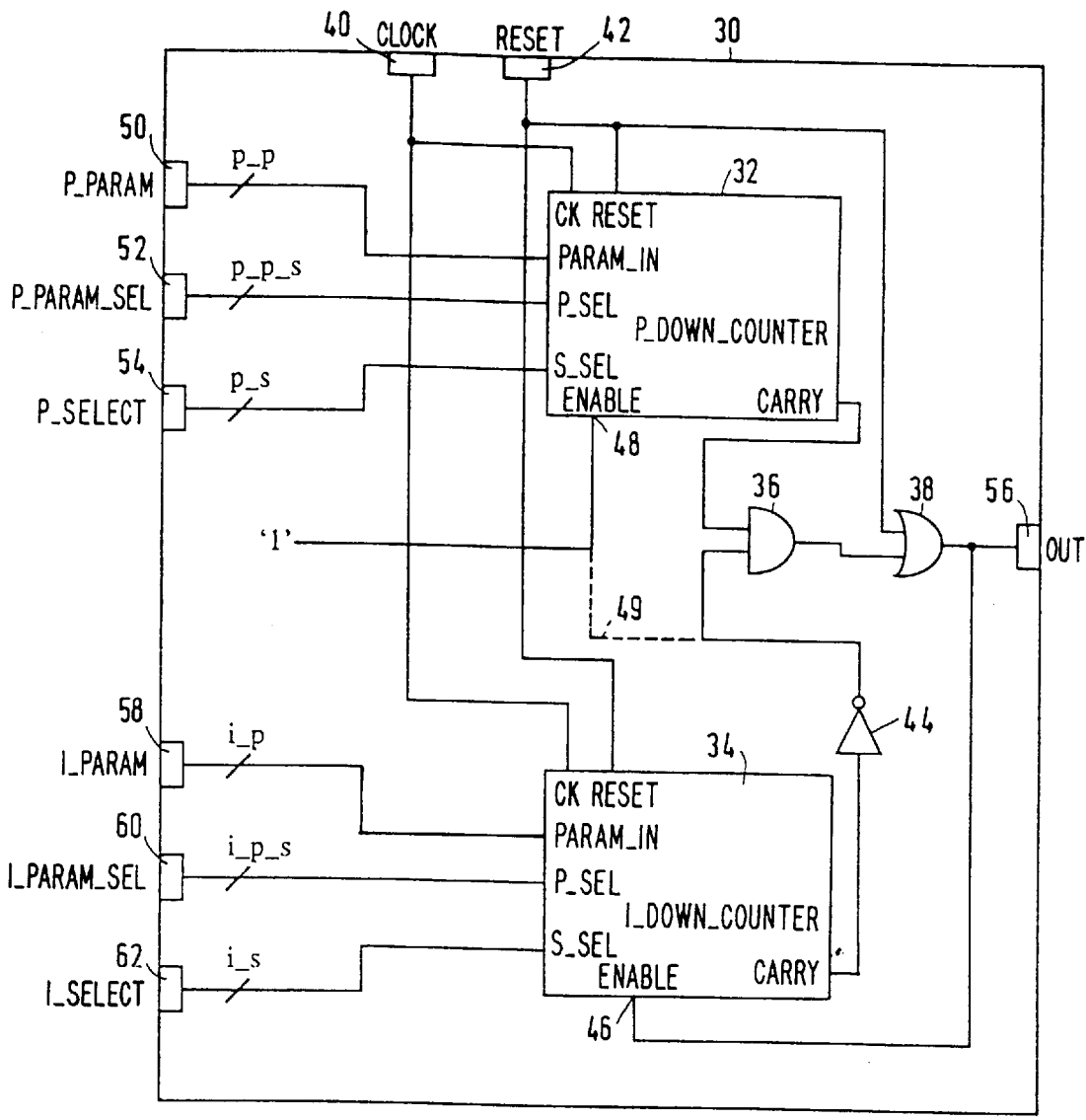
FIGS. 4–7 various control module configurations.

FIG. 4 shows a first module configuration 30 that has full facility. It comprises a p_down_counter 32 that receives a clock signal 40, a reset signal 42, a p_param(eter) value 50, a p_param(eter)_sel(ection) signal 52, and a p_select(ion) signal 54 of appropriate bit widths. The enable input 48 is always high at '1'. By itself, down counters are standard circuits under various different design systems and solid state technologies, and no further detailing on the transistor level is necessary. For an embodiment at gate level, see hereinafter. Carry output is normally zero, but upon attaining of the zero counter state becomes high. In parallel with counter 32, also counter 34 receives the clock and reset signals. Moreover, counter 34 receives the parameter value, parameter selection, and i selection signals. In contradistinction to counter 32, the enable signal for counter 34 is normally low, in that the output of AND gate 36 is low. The output of inverter 44 is normally high. The carry from counter 32, via OR 36 and AND 38, enables counter 34 for one clock pulse; also an output pulse is produced on output 56. At the next clock pulse, generally the carry from 32 is low again, thus disenabling counter 34. When counter 34 attains zero, its carry becomes high, thereby blocking gate 36. The start of a new cycle necessitates a reset.

The circuit as shown can be used for multiple hardwired p values and a p parameter (of which one is >1), and also multiple hardwired i values and an i parameter (of which one is >1). The word width of the p or i parameter is given by p_p and i_p, respectively. The values of p_p_s and i_p_s are 1. The number of bits necessary for selecting one hardwired p or i value are given by p_s and i_s, respectively.

Figure 5:
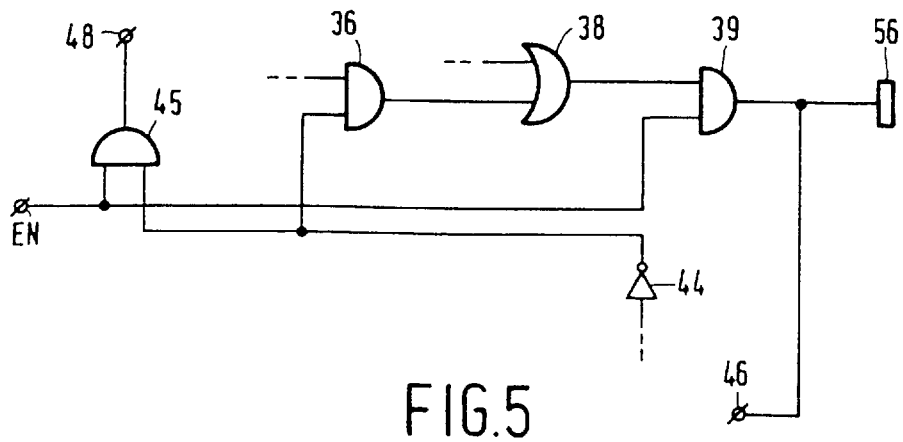

The control module of FIG. 4 may be modified in several ways. A first modification is to feed the enabling input 48 of down counter 32 by means of line 49 from inverter 44, instead of by means of an external signal generator. In this way, less power is consumed. However, due to the long feedback line the circuit may operate less reliably at high clock frequencies. A second amendment is shown in FIG. 5. Items 36, 38, 44, 46, 48, 56 have been shown in FIG. 4. Two additional AND gates 39, 45 may be blocked by an external Enable signal EN. In this way, the operation of the circuit may be suspended during, an arbitrarily long time. Again, due to the long feedback line the circuit may operate less reliably at high clock frequencies.

Figure 6:
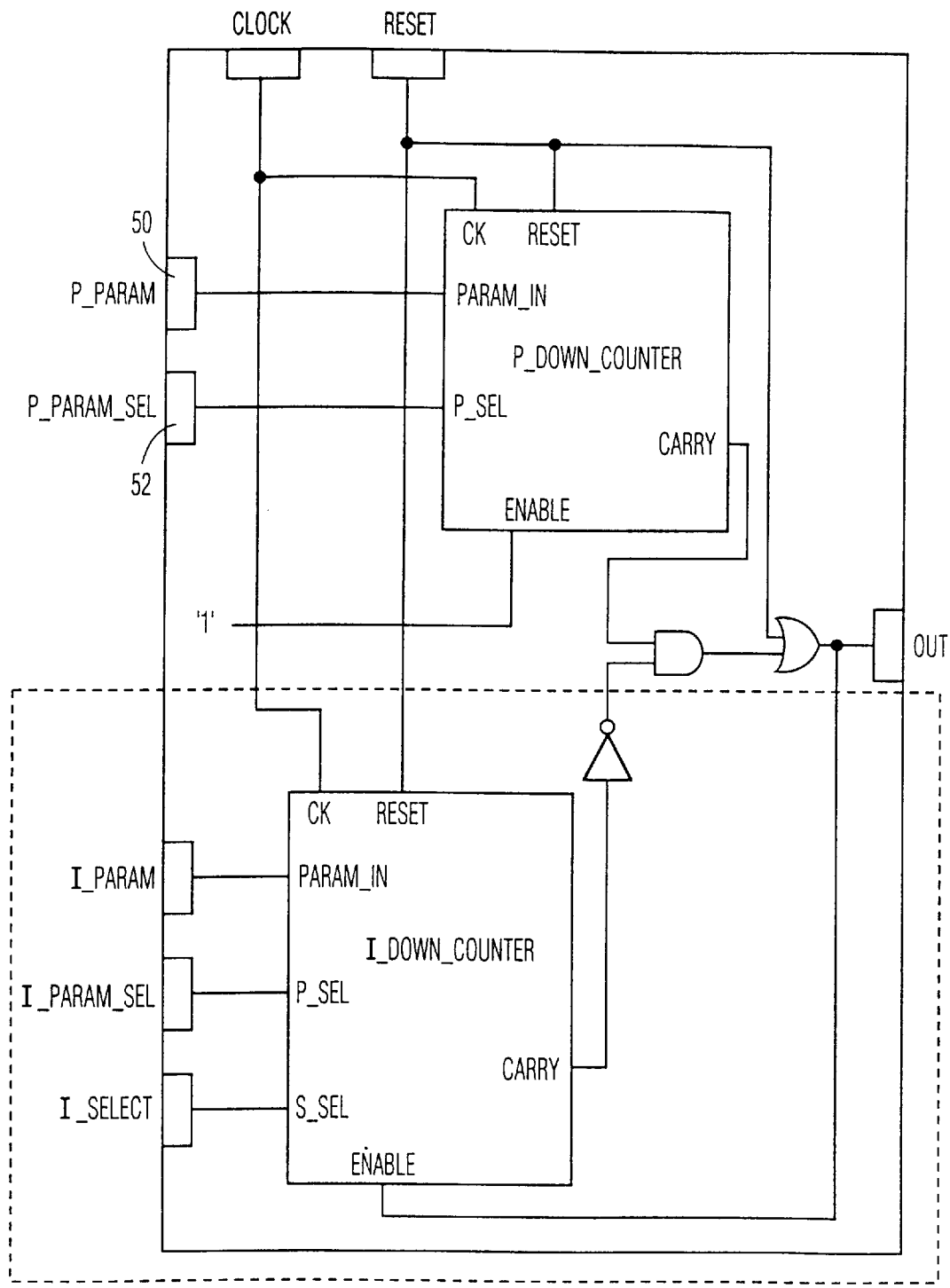

In this respect, FIG. 6 shows a further module configuration 30 that has restricted facilities. In particular, the second counter has been suppressed, together with input 54 of the upper counter. Gates 36, 38 may be suppressed as well. In a geometrical realization, where the logic is wired logic, the layout can be maintained however. This configuration is used in case there is only a single one hardwired p value AND there is a p parameter input, one of which being >1.

If there is only a parameter (>1) for p value, the facilities can be even more restricted than in FIG. 6, in that input 52 is suppressed. In contradistinction, if there are multiple hardwired p values (one of which is >1), but no p parameter, the second counter can be suppressed, together with inputs 50, 52, whereas input 54 is maintained. In further differentiation, if there is only a single hardwired p value >1, the second counter can be suppressed, together with all three inputs 50, 52, 54. In still further differentiation, if there is only a single hardwired p value=1, both the first and the second counters can be suppressed. Instead gate 36 is fed by the enabling '1' signal of FIG. 4, while OR gate 38 receives the reset signal.

Figure 7:
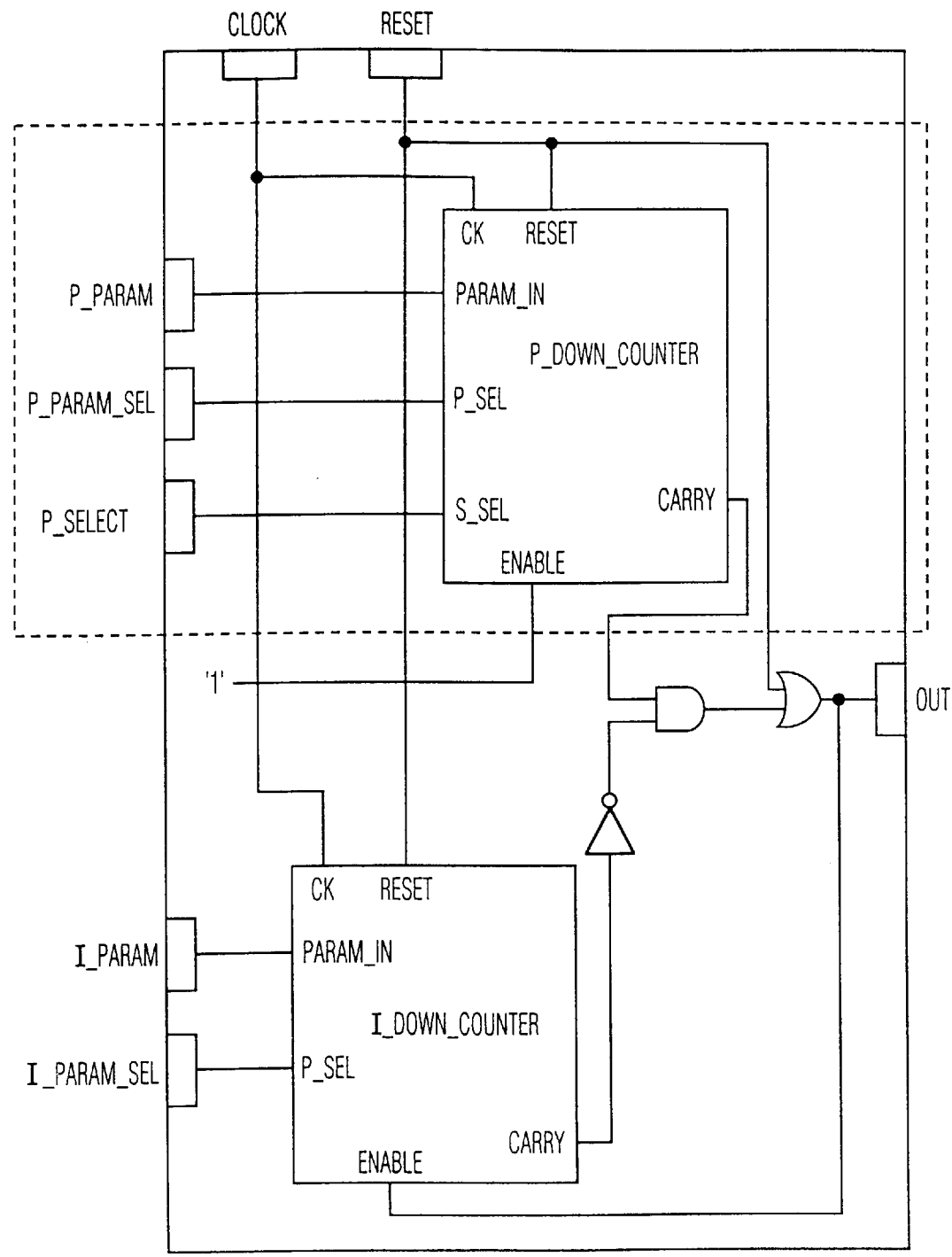

In this respect, FIG. 7 shows a further second module configuration 30 that has restricted facilities. In particular, the first counter has been suppressed, together with input 62 of the lower counter. Gates 36, 38 may be suppressed as well. In a geometrical realization, where the logic is wired logic, the layout can be maintained however. This configuration is used in case there is only a single one hardwired i value AND there is a i parameter input, one of which being >1.

If there is only a parameter (>1) for i value, the facilities can be even more restricted than in FIG. 6, in that input 60 suppressed. In contradistinction, if there are multiple hardwired i values (one of which is >1), but no i parameter, the first counter can be suppressed, together with inputs 58, 60 is, whereas input 62 is maintained. In further differentiation, if there is only a single hardwired i value >1, the first counter can be suppressed, together with all three inputs 58, 60, 62. In still further differentiation, if there is only a single hardwired i value=1, both the first and the second counters can be suppressed. In that case the module is rudimentary, in that only a connection from the reset input to output 56 need be realized.

Figure 8:
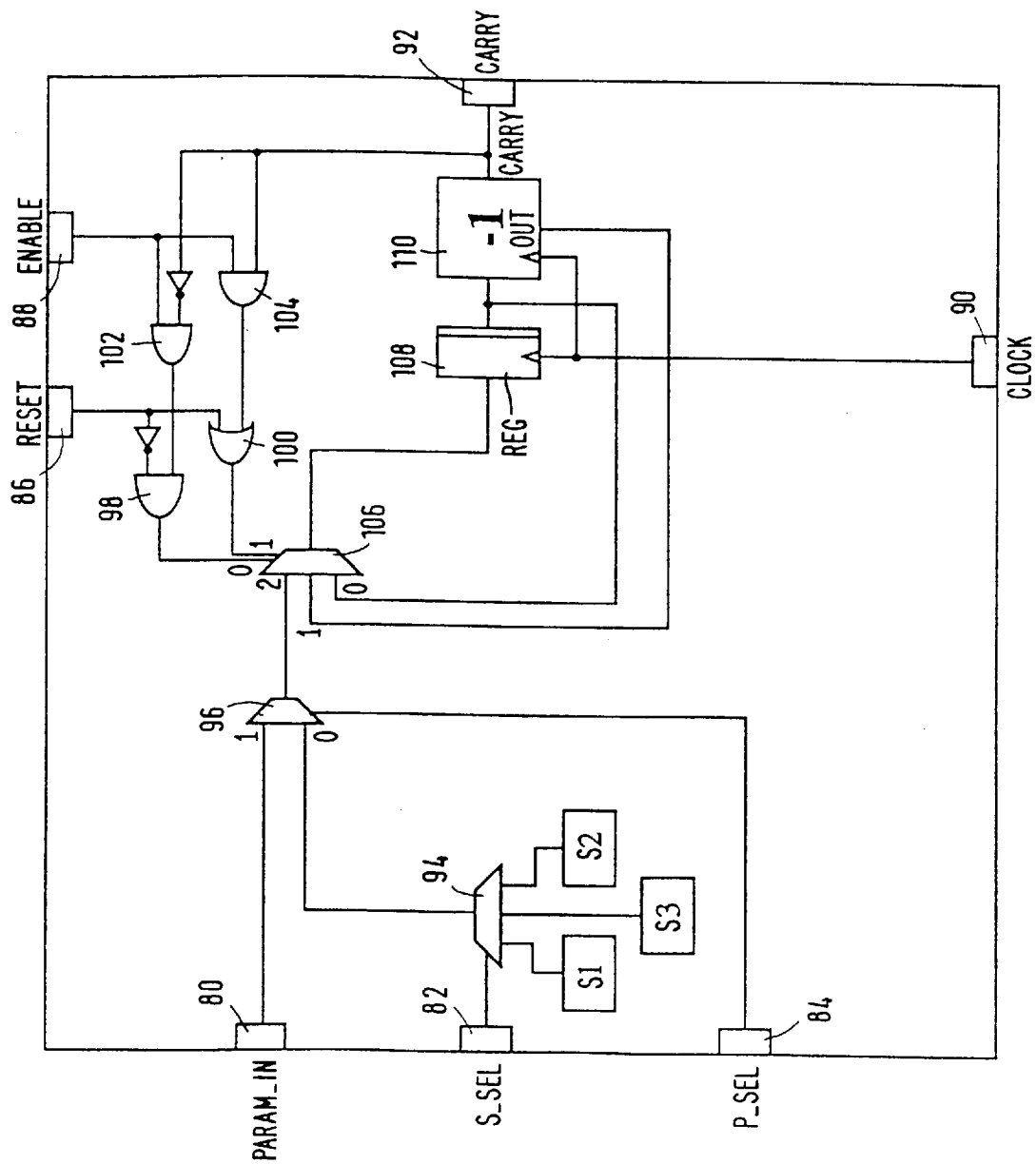
FIG. 8 a modifiable down-counter configuration.

FIG. 8 shows a down-counter configuration, that can be used for either of the preceding module realizations. This one is used when there are multiple preset start values (s1 . . . s3) and a parameter start value. The counter has clock input 90, reset input 86, and enable input 88. Furthermore, there is a parameter input 80 and start value selection input 82. Both of these may have a value greater than one. Finally, input 84 receives the p_selection signal. Now, the signal on input 82 selects one of the start values s1 . . . s3; it should have an appropriate width for controlling multiplexer 94. The signal bit on input 84 selects between the start value presented, and the parameter signal fed from the input 80, by means of multiplexer 96. Multiplexer 106 feeds register 108 and is controlled by the reset and enable signals on inputs 86, 88, respectively, and by the carry signal from decrementer 110.

The register output feeds decrementer 110 that has a data output (out) and a carry output; the latter produces a '1' when the register contains the value ..001. The carry is fed to output 92. Register 108 and decrementer 110 are activated by the clock signal. Multiplexer 106 receives the output signals from multiplexer 96, from register 108, and from derementer 110. Multiplexer 106 is controlled by the reset and enable signals, in cooperation with the carry signal, by means of gates 98, 100, 102, 104. The logic formed is as follows:

| reset | enable | carry | 98 | 100 | 102 | 104 | value |
|---|---|---|---|---|---|---|---|
| 0 | 0 | 0 | 0 | 0 | 0 | 0 | 0 |
| 0 | 0 | 1 | 0 | 0 | 0 | 0 | 0 |
| 0 | 1 | 0 | 1 | 0 | 1 | 0 | 1 |
| 0 | 1 | 1 | 0 | 1 | 0 | 1 | 2 |
| 1 | 0 | 0 | 0 | 1 | 0 | 0 | 2 |
| 1 | 0 | 1 | 0 | 1 | 0 | 0 | 2 |
| 1 | 1 | 0 | 0 | 1 | 1 | 0 | 2 |
| 1 | 1 | 1 | 0 | 1 | 0 | 1 | 2 |

Therefore, as long as both reset and enable are zero, the register content is fed back. If enable is one, but both carry and reset are zero, the output of the decrementer is fed back. If reset is one, or both enable and carry are one, a new parameter value is loaded, either from the outside, or from storage s1. . . s3.

In various circumstances, the counter configuration can be modified. First, if there is only a single preset start value, and a parameter start value, multiplexer 94 and the associated selection signal 84 may be suppressed. Second, if there is only a parameter start value, also multiplexer 96 and the associated control signal 84 may be suppressed, so that then input 80 directly feeds multiplexer 106. Third, if there are multiple preset start values, but no parameter start value, the output of multiplexer 94 may directly feed multiplexer 106, and inputs 80, 84, and multiplexer 96 may be suppressed. If there is only a single preset start value, multiplexers 94, 96, the associated control signals 82, 84, and parameter_in signal 80 may be suppressed, but the preset start value signal directly feeds multiplexer 106.

Figure 9:
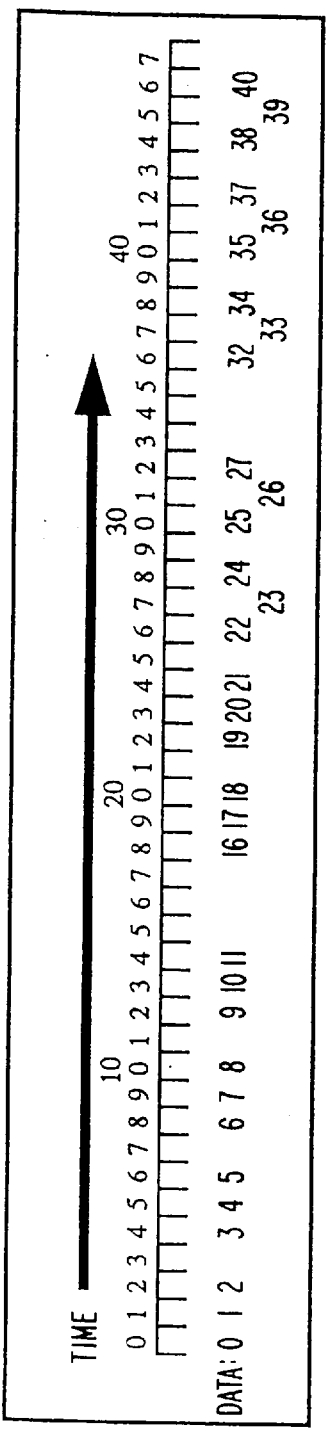
FIGS. 9–11 an exemplary use of the control module.
Figure 10:
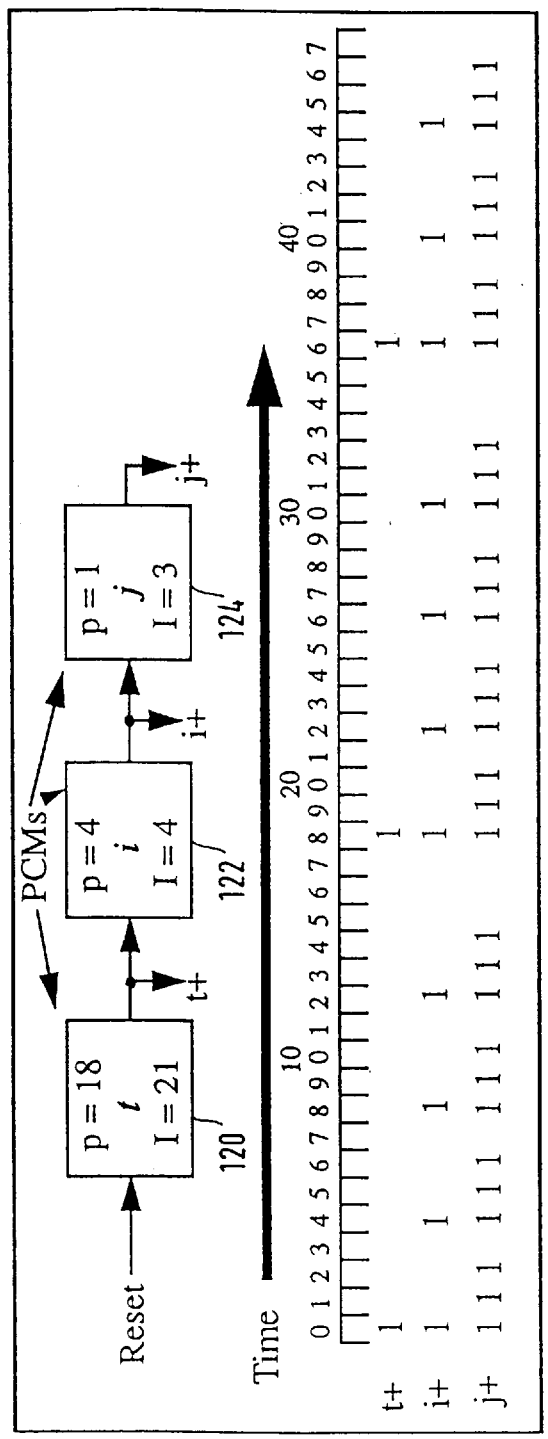
Figure 11:
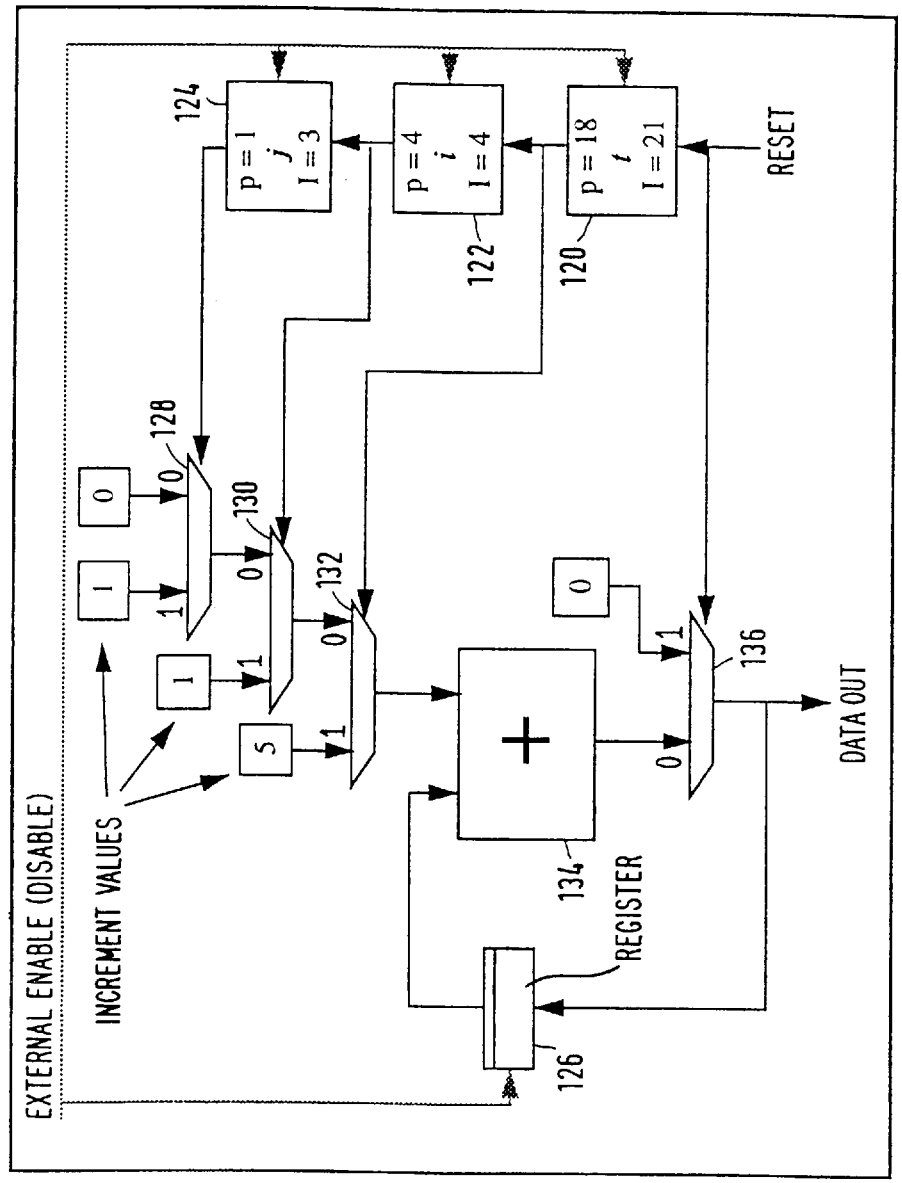

FIGS. 9–11 illustrate an exemplary use of the control module according to the present invention. The application is the incremental generation of a data word sequence under the control of a chain of the invented modules. The data words may effectively represent addresses. The data word sequence is given as nested loops, as follows:

$$\text{for}(t = 0 \ldots 20) \quad \{18\}$$
$$\text{for}(i = 0 \ldots 3) \quad \{4\}$$
$$\text{for}(j = 0 \ldots 2) \quad \{1\}$$
$$\text{data}(3^*) + j + (16^*t);$$

The period wherein t increments is 18 clock ticks. The sequence of data words is: 0, 1, 2, 3, 4, 5, 6, 7, 8, 9, 10, 11, 16, 17, 18, 19, 20, 21, 22, 23, 24, 25, 26, 27, 32, 33, 34, 35, 36, 37, 38, 39, 40, 41, 42, . . .

FIG. 9 shows along the axis of time the instances on which the various data words are produced; these are not uniform in time. FIG. 10 shows a first realization by means of three modules 120, 122, 124 according to the invention, wherein the production of '1' bits by the various modules has been shown along the time axis. Clearly, the increment on the data value when the j-loop iterates is +1, when the i-loop iterates it is $$i_{coeff}-(j_{max}*j_{coeff})=3-(2*1)=+1,$$

and when the t-loop iterates it is $$t_{coeff}-(i_{max}*i_{coeff})-(j_{max}*j_{coeff})=16-(3*3)-(2*1)=+5.$$

Following description of the chained modules 120, 122, 124, the following architecture of FIG. 11 has been developed to produce the chain of data words. The set-up has three multiplexers 128, 130, 132, controlled by the modules, a fourth multiplexer 136 controlled by the reset signal, register 126, and accumulator 134, and various signal generators as shown in blocks labelled with the increment values. The suspending of the progress can be executed again as shown in FIG. 5.

The module as described supra can be advantageously used in repetitive manner in a controller architecture described with reference to FIG. 12. The control generation part 140 of such a design 146 contains all the parametrizable modules plus some further hardware, to produce all required control bit sequences. The condition generation block 142 contains the boolean logic necessary to convert the raw condition values into the set of more complex conditions which are required for the signals. The AND/OR network 144 implements the ANDing of bit sequences with conditions, together with the ORing of the results to produce the final control signals, as defined in the specification of the overall controller.

Figure 12:
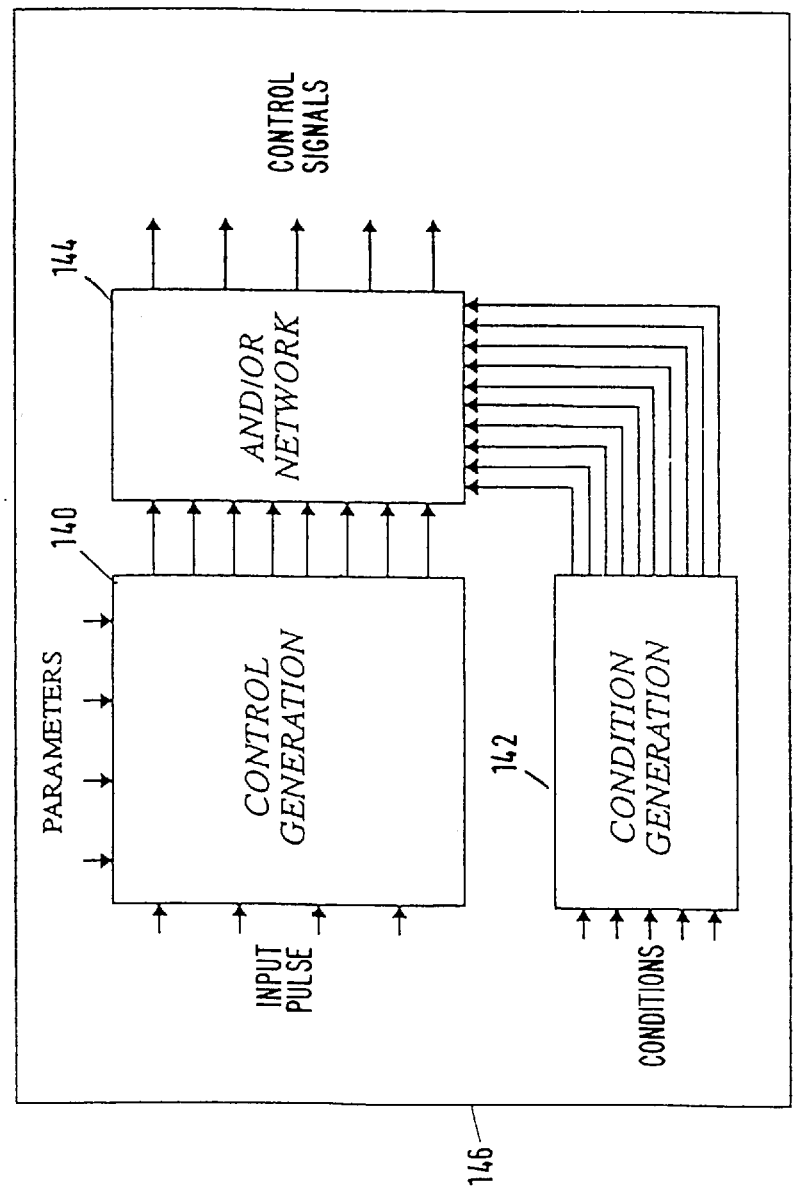
FIG. 12 illustrates a controller employing the paramitrizable modules according to the invention.
Figure 13:
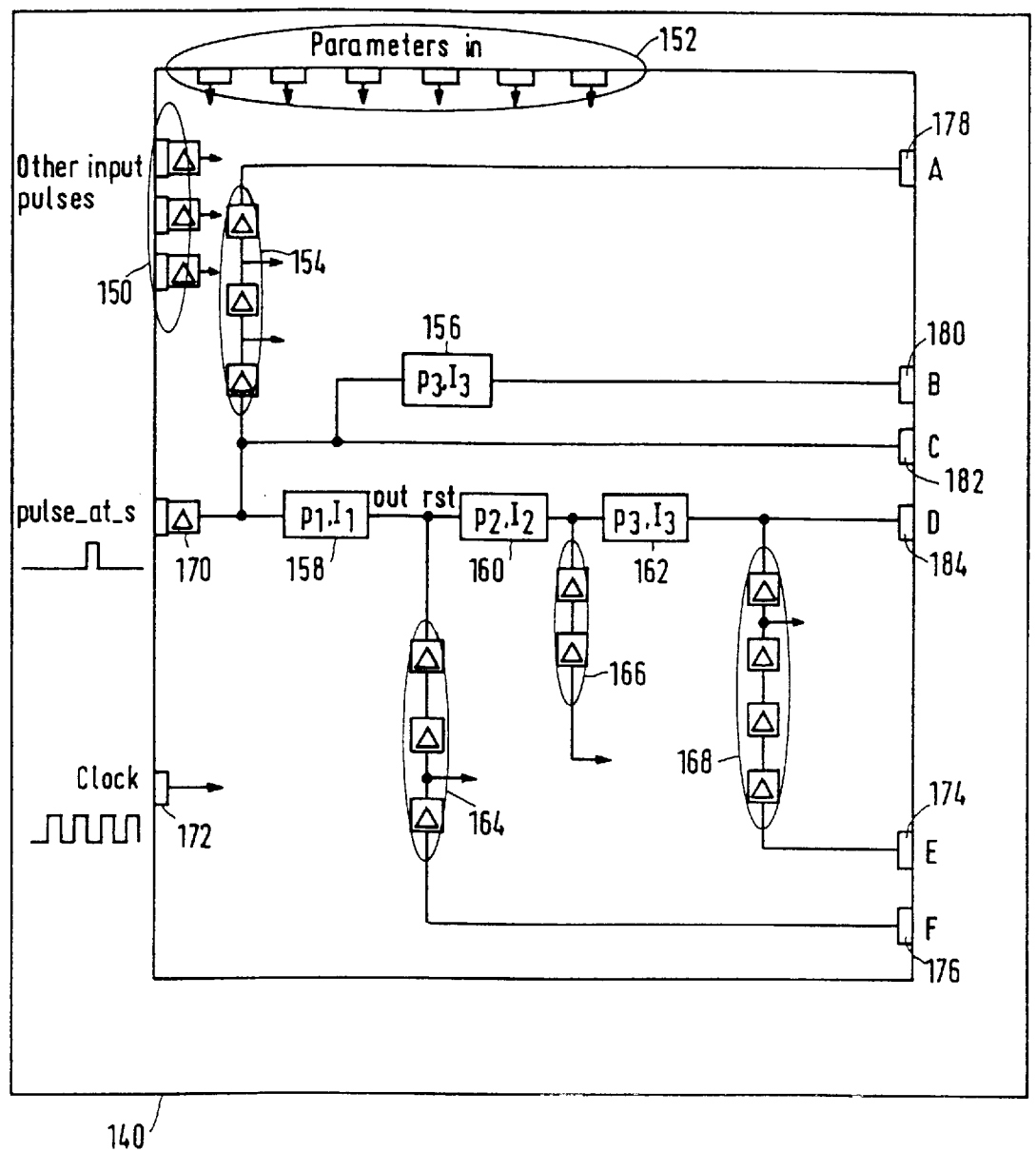
FIG. 13 illustrates the block 140 of FIG. 12.

In the arrangement of FIG. 12, the control generation part 140 is the most complex block, of which the target architecture has been shown in FIG. 13 by way of exemplary embodiment. There are input ports such as 150, 152, 170, 174, 176, latched in part, for receiving reset pulses generated elsewhere, and for parameters as specified. Shift registers such as 154, 164, 166, 168, that may be tapped, may be included to delay either the input pulses or the outputs of parametrizable control modules 156, 158, 160, 162, and the control modules may be interconnected to various output ports 178, 180, 182, 184, and reset ports as shown by way of example. Also clock input 172 is provided.

SYNTHESIS OF PARAMETRIZABLE CONTROLLERS

Hereinafter, a method is described for flexible and straightforward synthesis of such circuits as shown in FIG. 13 by way of a non-limitative example, relating to a motion estimator controller for television representation. At the outset, each control signal is specified in terms of all conditions present, that are given in a list of conditions at the start of a specification, along with their possible values. Some of the conditions may be redundant, in that their value is don't care <*>. The latter conditions are removed from each signal specification.

For example, given the condition list, as pertaining to a television frame processing environment:
condition="latestripe"<0,1>, "oddline"<0,1>, "blockstart"<0,1>, "blockend"<0,1>, "firststripe"<0,1>, "mem_hld"<0,1>, "repeat"<0,1>, "fieldno"<0,1,2,3,>;
the signal
"control_sig_n"<-1:0; s=5; p=[20,5]; I=[100,7]; conditions="latestripe"<*>, "oddline"<*>, "blockstart"<1>, "blockend"<*>, "firststripe"<*>, "mem_hld"<0>, "repeat"<*>, "fieldno"<*>;
becomes:
"control_sig_n"<-1:0; s=5; p=[20,5]; I=[100,7]; conditions="blockstart"<1>, "mem_hld"<0>;

Further, a shift value s=5 may be defined for the control signal. For instance, a memory write control may need to be delayed because of memory port contention. The simplest way to remove the shift value is to add it to the start time. This only causes a problem, if the start time functions as parameter value.

There can be signals with parameter start times that also require a shift value to be removed. This is implemented by introducing a new parameter, to be input to the control generator, and defined according to:

"tempp_n"<"start_time_parameter"+/−shift_time>;

wherein n is a unique integer. If the shift time is negative, such as because an accelerated Read access has been done on a memory, then the minus sign is applied.

Control signals that are defined in terms of control word sequences must be split into their constituent control bit sequences. For instance, the signal cyclic_0_ctrl was originally defined in terms of two-bit control words. Now, any signal with that name is split into two single-bit control signals named cyclic_0_ctrl_0 and cyclic_0_ctrl_1, respectively, whose only allowable difference may reside in the Required and Default values for the signals. Any signals with the same names after this stage must have the same Default values, but not by necessity the same Required values.

The optimization process is executed as follows. A control signal without assigned value in the specifying stage will be indicated as * (don't care). The latter indication is used to reduce the number different bit sequences that must be ORed to produce the required bit sequences. Thus:

1. Find a signal with an undefined Default value;
2. Join all signals with the same name as the first one in a group;
3. Compare the number of signals with Required value "1" against the number with a Required value "0";
4. Whichever Required value is most common, choose that as Default value for all the signals with a small bias towards "0".

Once the above has been done for all signals in the specification, any signals that have identical Required and Default values are thrown away, as they then need no longer a generator. Another optimization is as follows. Any signal defined in terms of more than one possible value of a condition is split up in as many equivalent signals as there are combinations of the conditions. Each of these signals will be exactly the same, apart from the single condition under which each is required. So:
"cyclic_0_ctrl_0<−0:1:s=5;p=["pfl"];I=[1]; condition="fieldno"<0,2>; becomes:
"cyclic_0_ctrl_0<−0:1:s=5;p=["pfl"];I=[1]; condition="fieldno"<0>;
"cyclic_0_ctrl_0<−0:1:s=5;p=["pfl"];I=[1]; condition="fieldno"<2>;

Once this is ready for all signals in the specification, we can start optimizing the conditions for each group of signals with the same name, the same start instant, etc. Using all possible conditions listed at the head of the specification, a string is made to represent the conditions under which each signal with the same name, etc. is required. These condition strings can then be used as input to a logic minimization software package describing the 'On-Set' for the channel, and are then translated back into conditions, with a single signal required for each condition string remaining.

There are further various optimizing rules for the period and the iteration vector for each signal. Thereto, first sorting is effected on the values within the vectors, so that their period length values are in decreasing order. The iteration values remain within their original associated period value. This is especially straightforward when the period vectors do not contain parameters. If however there are parameters present, the minimum and maximum values of each parameter are determined and compared with each other and with non-parameter values for sorting the vectors. For example, a particular signal "errsum_error1_1_mux_c_1" with start time s=22, has vectors p=["pfl",16,1,4];I=[1,"pl",4,2]. From the definition of parameter "pfl" we can determine its minimum to be 720, which is greater than 16, so no swap is required. The sorting continues and produces the vectors: p=["pfl",16,4,1] and I=[1,"pl",2,4]. If there exists any ambiguity over which p value is larger, then we cannot sort the vectors, and need not continue with vector optimization for that signal. Once all vectors have been sorted in this way, the vector optimization proper begins. The first rule is:

If $p_{n-1}=p_n*I_n$, then: $I_{n-1}=I_{n-1}*I_n$; $p_{n-1}=p_n$, and we can throw away $p_n$ and $I_n$. In the above example, we get;
1. 4=1*4
2. So new vectors are: p=["pfl",16,1] and I=[1,"pl",8].
3. 16≠1*8, so the process is finished. Examining the bitstream proves correctness of the above.

If there exist parameters in the vectors, the parameter definitions are checked whether indeed $p_{n-1}=p_n*I_n$. If yes, either a new parameter is created to describe the new $I_{n-1}$, or an existing parameter is used that has the correct definition. For example, the signal "diff_off_0_cand_0" has vectors p=["pgl",16,4] and I=[1, "pl",4]. Here 16=4*4;

furthermore, a new parameter is defined "tempp_1<"pl"*4>, and the vectors become p=["pfl'4] and I=[1, "tempp_1"].

Finally, remaining vector pairs are optimized as follows. Since the control sequences are defined for a single cycle of the processing, they repeat for every cycle. Any p, I vector pairs that have $p_1$ equal to the cycle length and $I_1=1$, may have these spurious values thrown away. Thus, signal "diff_off_0_cand_0" has final vectors p=[4], I=["tempp_1"].

At this point a reset signal is assigned to each signal in the specification, which takes the form of pulse_at_s, where s is either the actual start time for that signal, or the name of the parameter which describes that start time. A signal that now has empty period and iteration vectors represents a single pulse at the given start time. Next, any signals that have period and iteration vectors with more than a single entry are split up into new signals that have single-entry vectors. Each such signal created is given a unique name temp_sig_UID, wherein UID is the identifier, and the reset signal for each control signal is made equal to the signal name just created. For example, "errsum_error_1_mux_c_1"<-1:0:s=22;p=[16,1];I= ["pl",8]; condition="latestripe" <0>,"repeat"<1>;reset_by="pulse_at_22";

becomes:

"temp_sig_12"<-1.0:s=22;p=[16];I=["pl"]; reset_by ="pulse_at_22"; and "errsum_error_1_mux_c_1"<-1:0:s=22;p=[1]; I=[8]; condition="latestripe"<0>, "repeat" <1>;reset_by="temp_sig_12";

During the final main stage of controller synthesis, the hardware implied by the specification is optimized before generating the netlist. While going to the specification so acquired, all different pairs p,I are picked up for control generating. Whilst iterating, for each p,I pair the control signals are searched that need such p,I values. These are separated into two groups. The first one contains those, whose control modules will be reset by an input pulse; the second, whose reset signal is produced by another module.

In the first group, the signals are sorted according to ascending start times, finding the minimum value of parameter start times if appropriate, and then begin;
1. make a unique name for a control module with single p and I values as given control_module_p_I_UID.
2. For each signal with the lowest start time, set its hardware equal to that name.
3. Set the variable this_sig_first_available to that start time. If the start time is a parameter, we find its minimum value from the parameter definitions, and use that as start time.
4. Set the variable this sig_now_desired to the next highest start time.
5. If the two times found in steps (3) and (4) are totally unrelated (Parameters have nothing in common or one time is a parameter and one time is not), then we would need a variable length shift register to delay the first signal in order to produce the second one, so instead we use a new control module to generate this signal later.
6. If the times found in (3) and (4) are related (either both are actual values, or both are defined by the same parameter), then we can compare the cost of a shift register of length (this_sig_now_desired–this_sig_first_available), and the cost of a new control module for the given p,I values, and select the cheapest solution, generally the one requiring the least silicon area.
7. Set this sig_first_available to the value this_sig_now_desired and return to step (4) as long as there are still signals to be implemented.

Now we still have a control module defined for every bit sequence which is reset by an input pulse, and a shift value defined for each sequence which has a start time later than the time of that pulse (signals on outputs 180 and 176 would now have hardware designed therefor).

Finally, the same thing is done for all bit sequences that are reset by an output from one of these control modules (possibly by a chain thereof), until all bit sequences defined in terms of p,I pairs have a name of some control module, and possibly a shift/delay value (e.g. signals on terminals 184 and 174 in FIG. 13). After p and I vector optimization some signals may have no vectors left, in which case they would use the input pulse defined as their reset_by signal, either directly (on terminal 182 in FIG. 13) or delayed (on terminal 178 in FIG. 13). Whereas now all parameter values to be included in the circuitry have been ascertained, the mapping of those parameters on the circuitry according to specification of the invention supra is straightforward to a person of ordinary skill in the art.

I claim:

1. A parametrizable control module comprising a first and a second loadable counting means, the first counting means being connected to a primary clock input and having a first output feeding an enable input of the second counting means, and a second output of the second counting means feeding a module output, characterized in that the first and second output by means of a logical combining gate feed both the enable input of the second counting means and the module output, in that the second counting means is clocked by said primary clock input whereby said first and second counting means count clock cycles of the primary clock input, and said module having a reset input that feeds the reset inputs of both counting means and the enabling input of the second counting means.

2. A module as claimed in claim 1, wherein at least one of the counting means has a parameter input.

3. A module as claimed in claim 1, wherein said counting means have a count value register that is retrocoupled by means of a decrementer and an injector, said injector having control means for instead of a retrocoupled value injecting either a parameter or a value for subsequent decrementing.

4. An electronic circuit comprising a plurality of parametrized control modules as claimed in claim 1.

5. A module as claimed in claim 2, wherein at least one of the counting means having a has parameter input as well as a parameter select input.

6. A module as claimed in claim 2, at least one of the counting means having a value select input.

7. A module as claimed in claim 5, wherein at least one of the counting means has has a value select input.

8. A module as claimed claim 7, wherein said counting means has a count value register that is retrocoupled by means of a decrementer and an injector, said injector having control means for injecting either a parameter or a value for subsequent decrementing.

9. A module as claimed in claim 8, further comprising secondary select means for selecting between said parameter and said value.

10. A module as claimed in claim 8, and having ternary select means for selecting between multiple instances of said value.

11. A module as claimed in claim 9, further comprising ternary select means for selecting between multiple instances of said value.

12. An electronic circuit comprising a plurality of parametrized control modules as claimed in claim 11.

13. An electronic circuit as claimed in claim 12, wherein said parametrized control modules are arranged in a serial chain.

14. A method for synthesizing a circuit as claimed in claim 12, said method comprising the steps of:

specifying each control signal in terms of one or more actual conditions, with associated values that may include shift values, within each iteration vector sorting all occurring values according to period length in a monotonous order;

if any parameter is present, determining minimum and maximum values of such parameter for taking into account for such sorting until no further unambiguous difference in size dictates further sorting according to said order;

under condition of If$p_{n-1}=p_n *I_n$, then: $I_{n-1}=I_{n-1}*I_n;p_{n-1}=p_n$, ignoring $p_n$ and $I_n$ and if $I_{n-1}$ is a parameter assigning $I_{n-1}$ to an appropriate other existing value of parameter, ignoring all p, I vector pairs that have $p_1$ equal to the cycle length and $I_1=1$, and mapping all parameters so ascertained on the circuit specification for synthesis.

15. A method for synthesizing a circuit as claimed in claim 13, said method comprising the steps of:

specifying each control signal in terms of one or more actual conditions, with associated values that may include shift values, within each iteration vector sorting all occurring values according to period length in a monotonous order;

if any parameter is present, determining minimum and maximum values of such parameter for taking into account for such sorting until no further unambiguous difference in size dictates further sorting according to said order;

under condition of If$p_{n-1}=p_n*I$,then:$I_{n-1}=I_{n-1}*I_n;p_{n-1}=p_n$, ignoring $p_n$ and $I_n$ and if $I_{n-1}$ is a parameter assigning $I_{n-1}$ to an appropriate other existing value of parameter, ignoring all p, I vector pairs that have $p_1$ equal to the cycle length and $I_1=1$, and mapping all parameters so ascertained on the circuit specification for synthesis.

16. A method as claimed in claim 15, wherein subsequently to the latter ignoring, for those remaining p,I pairs whose control modules will be reset by an input pulse, sorting associated signals according to ascending start times, and hierarchically solving the control module specifying problem by:

generating a unique name for a control module with single p and I values;

for each signal with lowest start time, setting its hardware equal to that name;

setting a first variable to that start time, while if the start time is a parameter, finding its minimum value from the parameter definitions, for using that as the start time;

setting a second variable to the next highest start time;

if the two times found in the latter pair of steps are unrelated in that their parameters have nothing in common or one time is a parameter and another time is not, then instead of using a variable length shift register to delay the first signal in order to produce the second signal, using a new control module to later generate the second signal;

but if the two times found in those latter pair of steps are related in that either both are actual values, or both are defined by the same parameter, then comparing the area-cost of a shift register of length (second variable-first variable), with the area-cost of an extra control module for the given p,I values, and selecting the best solution;

setting the first variable to the value of second variable and return to the latter one of the above pair of steps as long as there are further signals to be implemented.

17. A method as claimed in claim 16, executing the same series of steps for all bit sequences that are reset by an output from one or a series of control modules defined earlier, until all bit sequences defined by p, I pairs have a name of a control module, while allowing for a shift/delay value associated therewith.

18. A controller system, comprising: a control generation block including one or more parametrizable control modules arranged in a serial chain, each module comprising a first and a second loadable counting means, the first counting means being connected to a primary clock input and having a first output feeding an enable input of the second counting means, and a second output of the second counting means feeding a module output, in each module the first and second output by means of a logical combining gate feed both the enable input of the second counting means and the module output, in that the second counting means is clocked by said primary clock input whereby said first and second counting means count clock cycles of the primary clock input, and said each module having a reset input that feeds the reset inputs of both counting means and the enabling input of the second counting means, and the module output of at least one module feeds a counting means of another said module, and outputs of the control generation block and producing externally usable cyclic control signals.

19. A system as claimed in claim 18, having such parametrizable control modules in serial and/or parallel organization.

20. A controller system, for generating control signals comprising:

a control generation block having at least one parametrizable control module, each module comprising a first and a second loadable counting means, the first counting means and the second counting means each being connected to a primary clock input and counting clock cycles of the primary clock input, the first counting means having a first output feeding an enable input of the second counting means, and a second output of the second counting means feeding a module output, a logical combining gate in each module feeding the first and second output to both the enable input of the second counting means and the module output, and each module having a reset input that feeds the reset inputs of both counting means and the enabling input of the second counting means, a condition generation block receiving condition signals and outputting output condition signals, and a logic network coupled to receive the output condition signals of the condition generation block and outputs of the control generation block to produce externally usable cyclic control signals.

* * * * *